(12) United States Patent
Bratschke et al.

(10) Patent No.: US 7,772,896 B2
(45) Date of Patent: Aug. 10, 2010

(54) METHOD FOR GENERATING A CLOCK FREQUENCY

(75) Inventors: Thomas Bratschke, Garbsen (DE); Gerd Schniedewind, Garbsen (DE)

(73) Assignee: Keymile GmbH, Hannover (DE)

( * ) Notice: Subject to any disclaimer, the term of this patent is extended or adjusted under 35 U.S.C. 154(b) by 140 days.

(21) Appl. No.: 12/225,964

(22) PCT Filed: Jan. 19, 2008

(86) PCT No.: PCT/EP2008/000395

§ 371 (c)(1),
(2), (4) Date: Oct. 2, 2008

(87) PCT Pub. No.: WO2008/116517

PCT Pub. Date: Oct. 2, 2008

(65) Prior Publication Data

US 2009/0167383 A1    Jul. 2, 2009

(30) Foreign Application Priority Data

Mar. 26, 2007    (DE) .................. 10 2007 014 294

(51) Int. Cl.
*H03L 7/06* (2006.01)
(52) U.S. Cl. ........................ 327/156; 327/147
(58) Field of Classification Search .......... 327/147, 327/156, 148, 157
See application file for complete search history.

(56) References Cited

U.S. PATENT DOCUMENTS

| | | | |
|---|---|---|---|
| 5,126,693 A | | 6/1992 | Gulliver et al. |
| 5,488,641 A | * | 1/1996 | Ozkan .......................... 375/374 |
| 5,883,536 A | * | 3/1999 | Patterson ...................... 327/184 |
| 6,114,879 A | * | 9/2000 | Popplewell et al. ............ 327/3 |
| 7,154,345 B2 | * | 12/2006 | Moyal et al. .................. 331/17 |

FOREIGN PATENT DOCUMENTS

| | | |
|---|---|---|
| EP | 0637137 | 2/1995 |
| EP | 0847142 | 6/1998 |
| EP | 1032133 | 8/2000 |

OTHER PUBLICATIONS

Roland Best; "*Theory and Applications of the Phase-Locked Loop;*" Germany, 1987, ISBN 3-85502-132-5; pp. 11-13.

* cited by examiner

*Primary Examiner*—Hai L Nguyen
(74) *Attorney, Agent, or Firm*—Alfred A. Fressola; Ware, Fressola, Van Der Sluys & Adolphson LLP

(57) ABSTRACT

A method and apparatus generates a clock frequency dependent on a reference clock signal and has a phase locked loop configuration. A multiplexer is connected into the transmission path of the respective incoming input signal, to which the corresponding input signal is fed directly, on the one hand, and in delayed fashion, on the other hand. The common clock signal used is a system clock signal, independent of the reference clock signal and the local clock signal and whose frequency is higher by a factor of at least "5" than the frequency of the reference clock signal and of the local clock signal, respectively. The temporal spacing between the edges of the undelayed clock signal, and of the delayed clock signal, is set such that it is greater than the temporal spacing of the sampling pulses of the phase detector that are predetermined by the system clock signal.

8 Claims, 3 Drawing Sheets

METHOD FOR GENERATING A CLOCK FREQUENCY

CROSS REFERENCE TO RELATED APPLICATIONS

This application is the U.S. National Stage of International Application Number PCT/EP2008/000395 filed on Jan. 19, 2008 which was published on Oct. 2, 2008 under International Publication Number WO 2008/116517.

TECHNICAL FIELD

The invention relates to a method and apparatus for generating a clock frequency dependent on a reference clock signal, using an arrangement which has a digital phase detector, a digital loop filter connected to the latter, and a digital/analog converter connected to the latter, to all of which a common clock signal is applied, in which a control voltage is available at the output of the digital/analog converter and in which a quartz-stable, controllable oscillator is connected to the output of the digital/analog converter, which oscillator generates as output signal a local clock signal corresponding to the clock frequency, in which the phase detector is fed the reference clock signal as first input signal via a first input and the local clock signal as second input signal via a second input, in which the relative phase angle of the two clock signals is ascertained in the phase detector by means of sampling pulses whose spacing from one another is determined by the common clock signal, in which a deviation of the phase angles is regulated by the oscillator in the sense of compensation and in which, upstream of one of the inputs of the phase detector, a multiplexer is connected into the transmission path of the respective incoming input signal, to which the corresponding input signal is fed directly, on the one hand, and via a delay circuit, on the other hand, and by which the reference clock signal or the local clock signal is fed to the phase detector either directly or in delayed fashion (EP 1 032 133 A1).

BACKGROUND OF THE INVENTION

For switching mechanisms generally and data transmission systems in particular, clock frequencies are required for the active components. They are generated by phase-locked loops, for example, which are known by the designation "PLL". Such a PLL operating in analog fashion is described for example by Dr. Roland Best in "Theorie und Anwendungen des Phase-locked Loops" ["Theory and applications of the phase-locked loop"], 1987, ISBN 3-85502-132-5.

A PLL is accordingly a regulating system which is used to synchronize the output signal of an oscillator (local clock signal) with an input signal in terms of frequency and phase. In the synchronized state of the PLL, the phase shift between the input signal and the output signal of the oscillator is intended to be minimal and as far as possible to tend toward zero. As soon as a phase shift occurs between the two signals, the oscillator is readjusted until the phase shift is zero or minimal again. Voltage-controlled oscillators (VCO) and current-controlled oscillators (CCO) are known. The PLL includes a phase detector and a loop filter alongside the oscillator.

A PLL operates without significant problems in analog systems. However, corresponding circuits are relatively complex, having many individual parts and a correspondingly large space requirement. Therefore, digital systems of simpler construction have been developed and are commercially available, but difficulties can occur in these systems since there are regions in which the phase detector does not supply information about the phase deviation between the two signals to be compared. The processing of digital datastreams in receiving circuits is disturbed as a result. Incorrect sampling can occur.

The known method according to EP 1 032 133 A1 mentioned in the introduction uses a PLL which has a small phase error, such that incorrect sampling can be precluded to the greatest possible extent. It has a digital phase detector, a digital loop filter connected to the latter, and a digital/analog converter connected to the latter, to all of which a common clock signal is applied. A quartz-stable, controllable oscillator is connected to the output of the digital/analog converter, which oscillator generates a local clock signal corresponding to the clock frequency to be regulated, said clock frequency being dependent on a reference clock signal, as output signal. The phase detector is fed the reference clock signal as first input signal via a first input and the local clock signal as second input signal via a second input. The relative phase angle of the two clock signals is ascertained in phase detector by means of sampling pulses whose spacing from one another is determined by the common clock signal. Upstream of one of the inputs of the phase detector, a multiplexer is connected into the transmission path of the respective incoming input signal, to which the corresponding input signal is fed directly, on the one hand, and via a delay circuit, on the other hand, and by which the reference clock signal or the local clock signal is fed to the phase detector either directly or in delayed fashion. The phase detector samples the phase angle of the two clock signals alternately shortly before and shortly after the respective edge. Incorrect sampling nevertheless cannot be precluded in case of this method either.

SUMMARY OF THE INVENTION

The invention is based on the object of improving the method and apparatus outlined in the introduction in such a way that it is possible to achieve more precise regulation of the clock frequency in a digitally operating PLL, such that incorrect sampling can be precluded.

This object is achieved according to the invention by virtue of the fact that the common clock signal used is a system clock signal which is independent of the reference clock signal and of the local clock signal and whose frequency is higher by a factor of at least "5" than the frequency of the reference clock signal and of the local clock signal, respectively, and in that the temporal spacing between the edges of the undelayed clock signal, on the one hand, and of the delayed clock signal, on the other hand, is set such that it is greater than the temporal spacing of the sampling pulses of the phase detector (PD) that are predetermined by the system clock signal.

By means of this method and apparatus, the reference clock signal or the local clock signal are fed, in a manner known per se, to the multiplexer directly, on the one hand, and in delayed fashion, on the other hand. At the output of the multiplexer, which is connected to the phase detector, the respective clock signal is then present directly or in delayed fashion for example alternately. The rising edge of the clock signal is accordingly present alternately with different temporal spacings, the length of which must be greater than the temporal spacings between the sampling pulses of the phase detector.

With application of this method, the spacings between the sampling pulses of the phase detector are determined by the system clock signal that is higher than the reference clock signal and local clock signal at least by the factor of "5". Consequently, a type of "oversampling" is effected by the phase detector, wherein, with each rising edge of the system clock signal, values of the clock signals present at the two inputs are read into the phase detector and processed. These sampling edges determined by system clock signal have such a small spacing from one another that the edges of the clock signals present at the two inputs of the phase detector cannot be missed. When this method is used, the phase detector acquires without interruption information about a possible phase shift between reference clock signal and local clock signal. The accuracy of the clock frequency for a data transmission system to be supplied is correspondingly improved because the oscillator can follow differences in the phase of reference clock signal and local clock signal more rapidly.

A jitter generator can additionally be connected to the multiplexer, said jitter generator being equipped with a microprocessor and a random generator, both of which are connected to a comparator connected to the multiplexer. The sequence of undelayed and delayed clock signals can be configured randomly by the jitter generator. By means of the microprocessor, the clock frequency present at the output of the digital/analog converter can also be defined in a completely targeted manner between two sampling pulses. The jitter generator is likewise fed the system clock signal that determines the mode of operation of all the parts of the PLL.

BRIEF DESCRIPTION OF THE DRAWINGS

The method according to the invention is explained in exemplary embodiments with reference to the drawings.

DETAILED DESCRIPTION

The delay circuit used in this method can be connected either into the transmission path of the reference clock signal or into the transmission path of the local clock signal supplied by the oscillator. The version "connection into the transmission path of the reference clock signal" is described below. The other version is applicable analogously to this.

Figure 1:
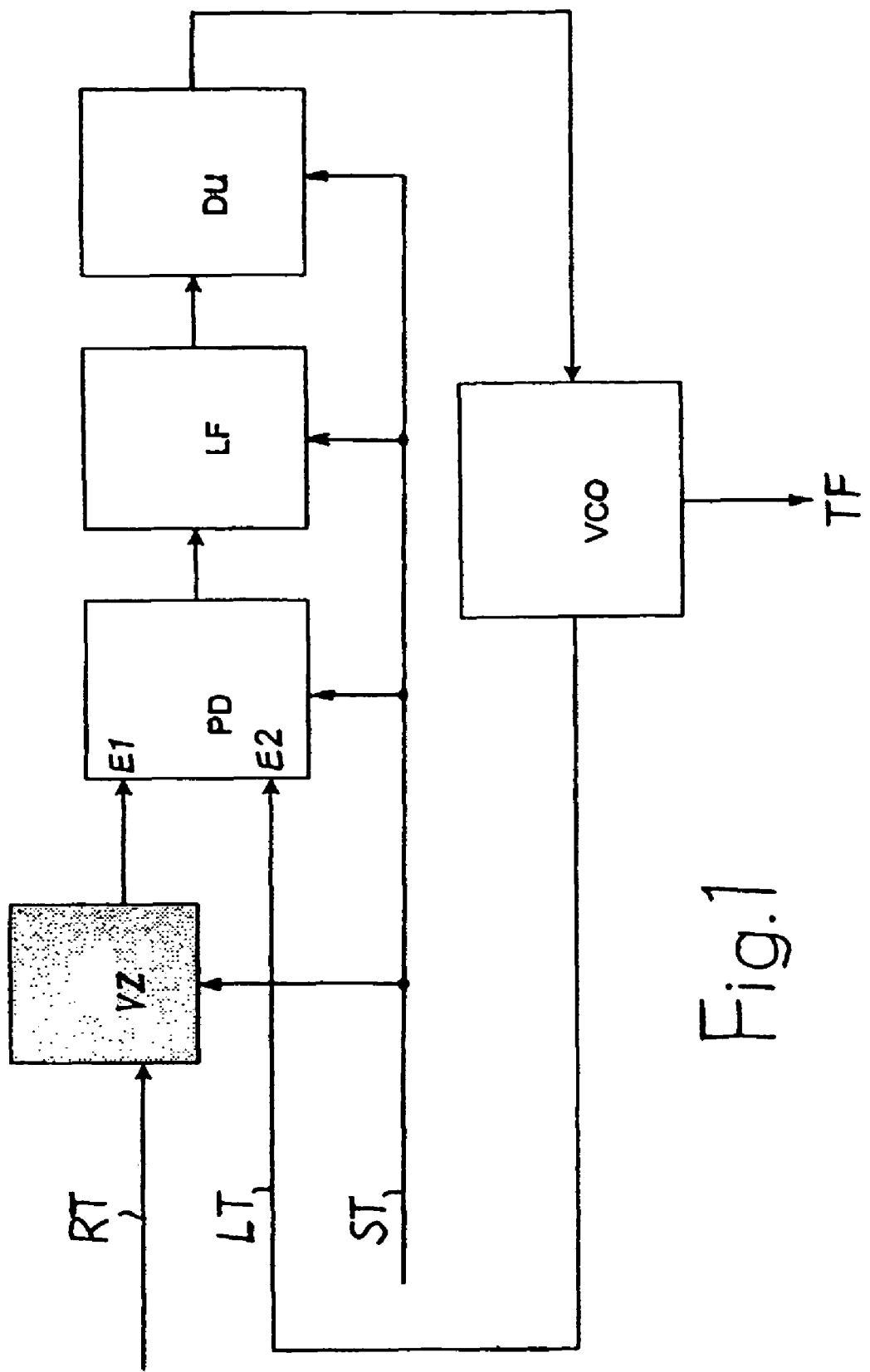
FIG. 1 shows a block diagram of an arrangement for carrying out the method according to the invention.

The phase-locked loop illustrated in FIG. 1 includes a digital phase detector PD, a digital loop filter LF connected to the latter, a digital/analog converter DU connected to the latter, and a quartz-stable, controllable oscillator VCO. A control voltage is present at the output of the digital/analog converter DU, to which the VCO is connected. The VCO supplies as output signal a local clock signal LT corresponding to the clock frequency TF to be generated. The local clock signal LT is fed to the PD as second input signal via a second input E2. A first input signal, representing the reference clock signal RT, is fed to the PD via the first input E1 thereof, to be precise via a delay circuit VZ, which is illustrated in more detail in two different embodiments in FIGS. 2 and 3. A system clock signal ST, which is generated by a quartz oscillator, for example, is applied to the represented units of the phase-lock loop—apart from the VCO. The frequency of the system clock signal ST is higher than the frequency of the clock signals RT and LT at least by the factor of "5". The higher the frequency of the system clock signal ST—with an expedient or practicable upper limit—the more precisely the method according to the invention operates.

Figure 2:
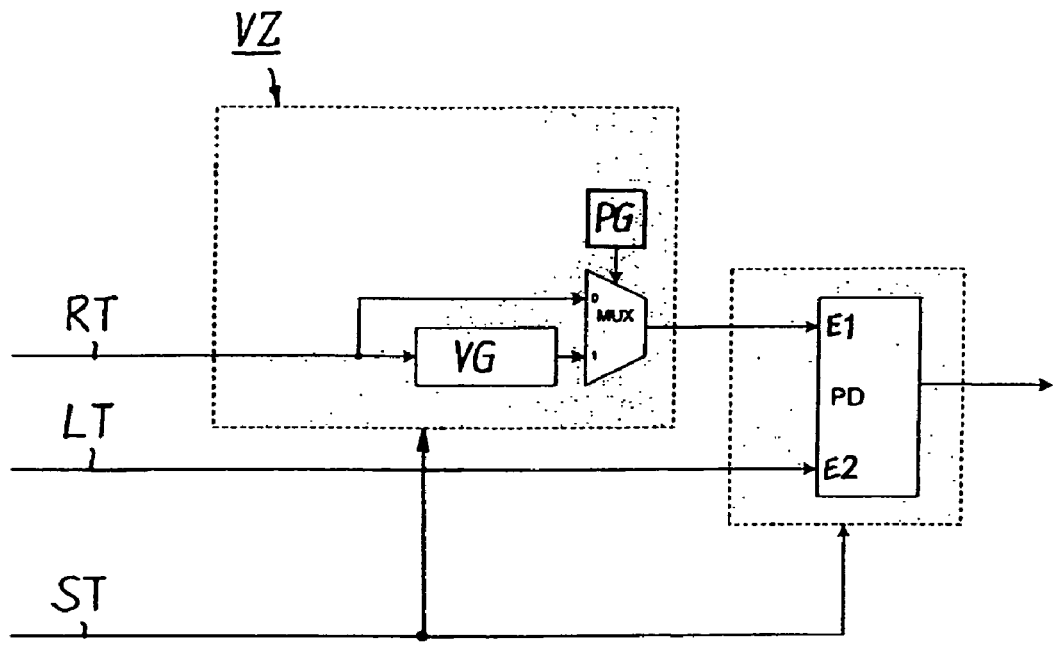
FIGS. 2 and 3 show two different embodiments of an element of the arrangement (apparatus) according to FIG. 1 in an enlarged illustration, likewise as block diagrams.

The delay circuit VZ has, in accordance with FIG. 2, a multiplexer MUX, to which the reference clock signal RT is fed directly on a first path and in a manner delayed via a delay element VG on a second path. The MUX is controlled by a clock or pulse generator PG. The PG supplies pulses—"1" or "0"—whose order can be set for example by a microprocessor connected to the PG. At the output of the MUX, which is connected to the first input E1 of the PD, either the undelayed or the delayed reference clock signal RT is present. The PG decides which of these two forms the reference clock signal RT is present at the output of MUX and in what sequence. In the simplest embodiment, the two forms are allowed to pass regularly alternately, such that the edges of the reference clock signal RT are present alternately in one instance in undelayed fashion and in another instance in delayed fashion at the input E1 of the PD. However, the PG can also set other sequences at the MUX. Thus, the undelayed edge can be supplied by the MUX for example in each case three times in succession, with an interruption by a delayed edge.

Figure 4:
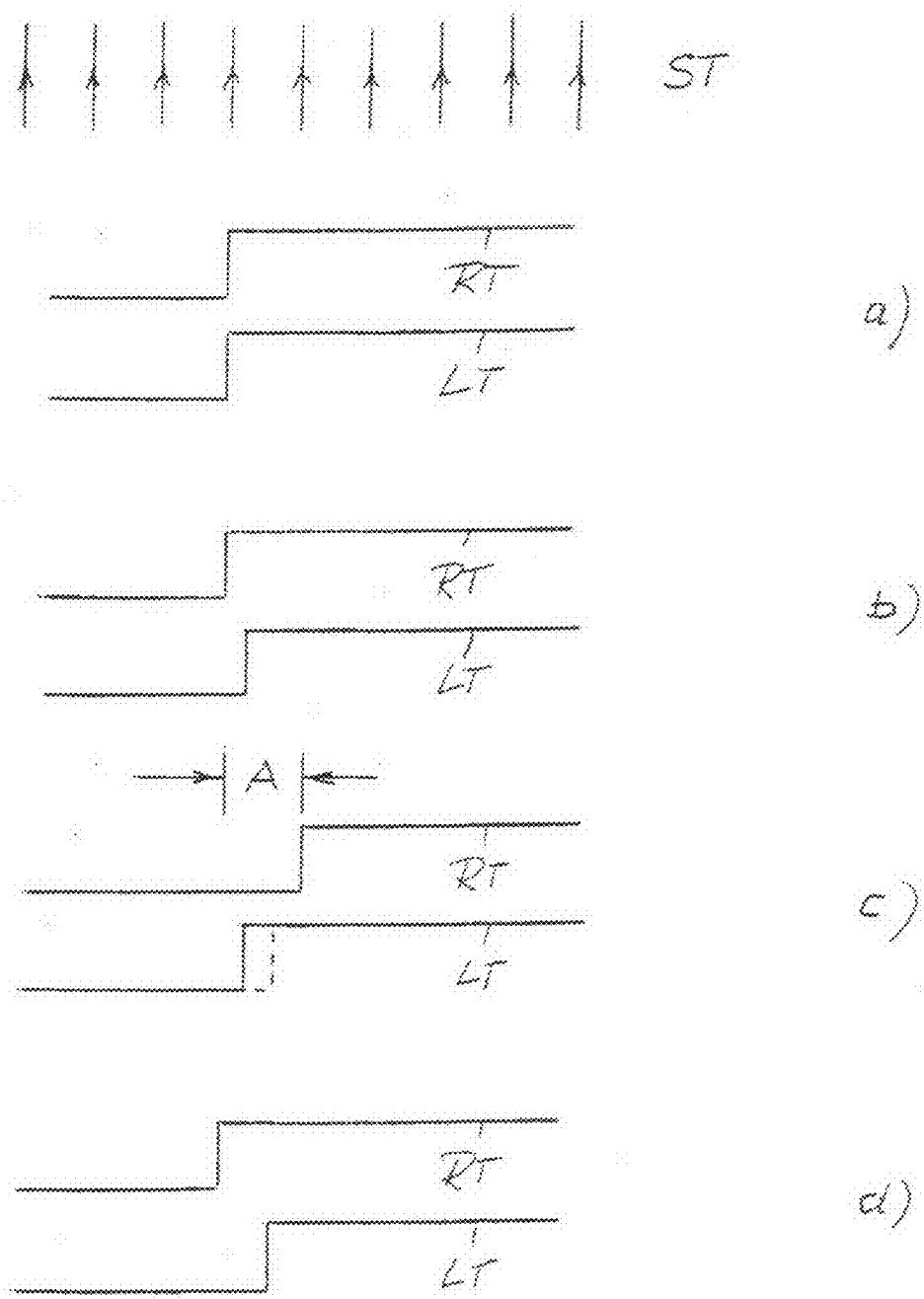
FIG. 4 shows excerpts from curved profiles that occur when the method is used.

The method according to the invention is explained below for the circuit according to FIG. 2 on the basis of the curve profiles illustrated in FIG. 4: The system clock signal ST is indicated by arrows at the top end FIG. 4. It has a frequency higher than that of the reference clock signal RT by a factor of at least "5". In a practical application, the frequency of the system clock signal ST is for example 66 MHz with a clock period of 16 nsec. The frequency of the reference clock signal RT and thus also that of the local clock signal LT are for example 1 MHz with a clock period of 1 µsec.

In the case of the phase angles illustrated in FIG. 4a, the edges of reference clock signal RT and local clock signal LT correspond temporally. They are thus both identified by the PD by means of the sampling pulses of the latter. Nothing has to be corrected. The clock frequency TF meets the requirements. If the phase of the local clock signal LT were shifted with its edge relative to the phase angle of the reference clock signal RT in accordance with FIG. 4b, although that would be identified by the PD in circuit arrangements using conventional technology, it would be without any information about the direction in which and the magnitude by which a shift has taken place. The clock frequency TF would be disturbed.

In order to close this information gap and at least reduce the risk of a corresponding disturbance, the reference clock signal RT is fed to the PD in undelayed fashion and in delayed fashion in a predeterminable or else random order in accordance with EP 1 032 133 A1 mentioned in the introduction. The phase angle or edge of the reference clock signal RT then "jumps" back and forth in the region A depicted in FIG. 4c. In accordance with FIG. 4c, the reference clock signal RT is fed to the PD in delayed fashion, to be precise with a temporal delay that is greater than the temporal spacing of the sampling pulses of the system clock signal ST from one another. The PD then identifies a "0" of reference clock signal RT and a "1" of the local clock signal LT, with the information that the local clock signal LT is to fast, that is to say must be delayed. The corresponding information is passed via the LF and the digital/analog converter DU to the VCO, which correspondingly delays the local clock signal LT. The edge of the local clock signal LT shifted by the corrected phase angle is depicted by dashed lines in FIG. 4c.

If, given this phase angle of the local clock signal LT, in accordance with FIG. 4d, an undelayed reference clock signal RT is present at the PD, then the latter identifies that the local clock signal LT is too slow. The VCO thus acquires the information that the local clock signal LT must be phase-shifted again in the direction "faster".

In this way, the phase angle of the local clock signal LT—owing to the high number of sampling pulses of the local clock signal LT—is brought to a stable position which, although it deviates from the phase angle of the reference clock signal RT, leads as a result to a stable clock frequency TF at the output of the VCO. The method is not limited by the reference clock signal RT being fed alternately in undelayed fashion or in delayed fashion to the input E1 of the PD, rather said signal can also be fed to the input E1 in a variable order, which can be predetermined by the PG, with for example delayed three times and undelayed once.

Figure 3:
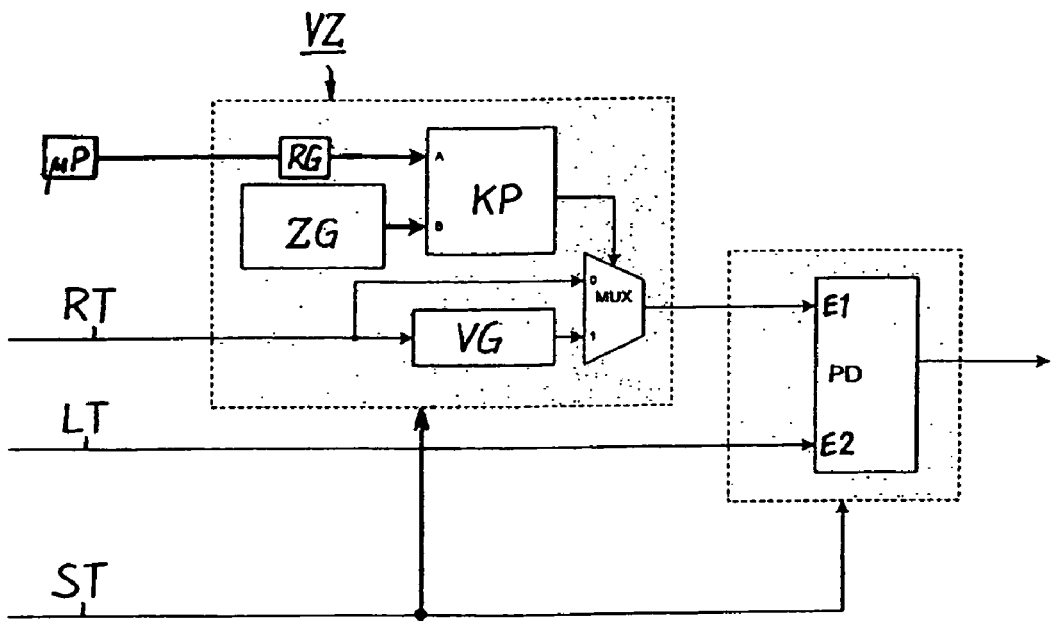

Furthermore, in accordance with FIG. 3, the sequence of undelayed and delayed reference clock signal RT can be controlled by a jitter generator comprising a random generator ZG, a microprocessor µP and a comparator KP. Random generator ZG and µP are connected to different inputs of the comparator KP, which is connected by its output to the MUX. The random generator ZG supplies numerical values in a random sequence, for example between 0 and 63. They are compared in the comparator KP with a numerical value fed from the µP or from an interposed register RG to which the µP writes the respective numerical value. Depending on whether the numerical value of the random generator ZG is greater than/equal to or less the numerical value of the µP, a "1" or a "0" is present at the output of the comparator KP. These output values of the comparator KP control the MUX, which thereby feeds the reference clock signal RT to the PD in delayed fashion or undelayed fashion.

If a sequence of 1:1 for the delayed and the undelayed reference clock signal RT arises—randomly—for example in this circuit, then the clock frequency TF to be regulated lies in the middle between two sampling pulses of the PD. By altering the numerical value fed to the comparator KP from the µP, this phase angle of the clock frequency TF can be shifted to another stable value in a targeted manner between two sampling pulses. This can advantageously be utilized for compensating for manufacturing tolerances of batches of components which are used in a data transmission system to be supplied by the clock frequency TF.

What is claimed is:

1. A method for generating a clock frequency dependent on a reference clock signal, using an arrangement which has a digital phase detector, a digital loop filter connected to the latter, and a digital/analog converter connected to the latter, to all of which a common clock signal is applied, in which a control voltage is available at an output of the digital/analog converter and in which a quartz-stable, controllable oscillator is connected to the output of the digital/analog converter, which oscillator generates as an output signal a local clock signal corresponding to the clock frequency, in which the phase detector is fed the reference clock signal as first input signal via a first input and the local clock signal as second input signal via a second input, in which the relative phase angle of the two clock signals is ascertained in the phase detector by means of sampling pulses whose spacing from one another is determined by the common clock signal, in which a deviation of the phase angles is regulated by the oscillator in the sense of compensation and in which, upstream of one of the inputs of the phase detector, a multiplexer is connected into the transmission path of the respective incoming input signal, to which the corresponding input signal is fed directly, on the one hand, and via a delay circuit, on the other hand, and by which the reference clock signal or the local clock signal is fed to the phase, detector either directly or in delayed fashion, comprising:

using the common clock signal as a system clock signal which is independent of the reference clock signal and of the local clock signal and whose frequency is higher by a factor of at least "5" than the frequency of the reference clock signal and of the local clock signal, respectively, and setting the temporal spacing between the edges of the undelayed clock signal, on the one hand, and of the delayed clock signal, on the other hand, such that the temporal spacing is greater than the temporal spacing of the sampling pulses of the phase detector (PD) that are predetermined by the system clock signal.

2. The method as claimed in claim 1, characterized in that the respective clock signal is fed to the phase detector either directly or in delayed fashion in regular alternation.

3. The method as claimed in claim 1, characterized in that the respective clock signal is fed to the phase detector directly or in delayed fashion in variable sequence.

4. The method as claimed in claim 1, characterized in that the multiplexer is connected to a comparator, to which a random generator and a microprocessor are connected via two separate inputs.

5. An apparatus for generating a clock frequency dependent on a reference clock signal, comprising:

a digital phase detector, a digital loop filter connected to the phase detector, and a digital/analog converter connected to the loop filter, to all of which a common clock signal is applied, in which a control voltage is available at an output of the digital/analog converter and in which a quartz-stable, controllable oscillator is connected to the output of the digital/analog converter, which oscillator generates as an output signal a local clock signal corresponding to the clock frequency, in which the phase detector is fed the reference clock signal as first input signal via a first input and the local clock signal as second input signal via a second input, in which the relative phase angle of the two clock signals is ascertained in the phase detector by means of sampling pulses whose spacing from one another is determined by the common clock signal, in which a deviation of the phase angles is regulated by the oscillator in the sense of compensation and in which, upstream of one of the inputs of the phase detector, a multiplexer is connected into the transmission path of the respective incoming input signal, to which the corresponding input signal is fed directly, on the one hand, and via a delay circuit, on the other hand, and by which the reference clock signal or the local clock signal is fed to the phase detector either directly or in delayed fashion, wherein the common clock signal used is a system clock signal which is independent of the reference clock signal and of the local clock signal and whose frequency is higher by a factor of at least "5" than the frequency of the reference clock signal and of the local clock signal, respectively, and wherein the temporal spacing between the edges of the undelayed clock signal, on the one hand, and of the delayed clock signal, on the other hand, is set such that the temporal spacing is greater than the temporal spacing of the sampling pulses of the phase detector that are predetermined by the system clock signal.

6. The apparatus as claimed in claim 5, characterized in that the respective clock signal is fed to the phase detector either directly or in delayed fashion in regular alternation.

7. The apparatus as claimed in claim 5, characterized in that the respective clock signal is fed to the phase detector directly or in delayed fashion in variable sequence.

8. The apparatus as claimed in claim 5, characterized in that the multiplexer is connected to a comparator, to which a random generator and a microprocessor are connected via two separate inputs.

* * * * *